United States Patent
Kim et al.

(10) Patent No.: US 8,247,950 B2
(45) Date of Patent: Aug. 21, 2012

(54) FLEXIBLE ENERGY CONVERSION DEVICE

(75) Inventors: Sanghyeob Kim, Daejeon (KR); Myungae Chung, Daejeon (KR); Sungwon Sohn, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 442 days.

(21) Appl. No.: 12/629,925

(22) Filed: Dec. 3, 2009

(65) Prior Publication Data

US 2010/0139750 A1 Jun. 10, 2010

(30) Foreign Application Priority Data

Dec. 4, 2008 (KR) .................. 10-2008-0122650

(51) Int. Cl.
*H01L 31/042* (2006.01)
(52) U.S. Cl. ........ 310/339; 310/328; 310/800; 136/243; 136/253; 136/263
(58) Field of Classification Search .................. 310/328, 310/800; 136/243–265
See application file for complete search history.

(56) References Cited

U.S. PATENT DOCUMENTS

| | | | | |
|---|---|---|---|---|
| 7,248,395 B2* | 7/2007 | Komatsu | ..................... | 359/296 |
| 7,586,035 B2* | 9/2009 | Gaudiana et al. | ............ | 136/263 |
| 7,705,523 B2* | 4/2010 | Wang et al. | .................... | 310/339 |
| 7,764,004 B2* | 7/2010 | Aizenberg et al. | ............ | 310/311 |
| 7,839,028 B2* | 11/2010 | Pinkerton | ....................... | 310/10 |
| 8,003,982 B2* | 8/2011 | Wang et al. | ..................... | 257/43 |
| 8,022,601 B2* | 9/2011 | Stollberg | ....................... | 310/339 |
| 8,039,834 B2* | 10/2011 | Wang et al. | ..................... | 257/43 |
| 8,168,087 B2* | 5/2012 | Gaudiana et al. | .......... | 252/501.1 |
| 8,174,667 B2* | 5/2012 | Allemand et al. | ............ | 349/187 |
| 8,179,026 B2* | 5/2012 | Russell et al. | ................. | 310/358 |
| 2005/0150541 A1 | 7/2005 | Scher et al. | | |
| 2005/0236985 A1 | 10/2005 | Handa et al. | | |
| 2007/0111368 A1* | 5/2007 | Zhang et al. | .................... | 438/99 |
| 2007/0251570 A1* | 11/2007 | Eckert et al. | .................. | 136/256 |
| 2009/0087939 A1* | 4/2009 | Lee | ................................ | 438/57 |
| 2010/0141095 A1* | 6/2010 | Park | .............................. | 310/339 |
| 2010/0253184 A1* | 10/2010 | Choi et al. | ..................... | 310/339 |
| 2012/0080086 A1* | 4/2012 | Yoon et al. | ..................... | 136/256 |
| 2012/0126129 A1* | 5/2012 | Nakatsugawa et al. | ....... | 250/369 |

FOREIGN PATENT DOCUMENTS

| | | |
|---|---|---|
| KR | 10-2005-0064566 A | 6/2005 |
| KR | 10-2006-0012785 | 2/2006 |
| KR | 10-2007-0047954 A | 5/2007 |

* cited by examiner

*Primary Examiner* — J. San Martin
(74) *Attorney, Agent, or Firm* — Rabin & Berdo, P.C.

(57) ABSTRACT

Disclosed is a flexible energy conversion device, comprising a first flexible substrate, a transparent electrode disposed on the first flexible substrate, a first nanostructure disposed on the transparent electrode and comprising a transition metal oxide or semi-metal oxide, a second nanostructure disposed on the first nanostructure, a second flexible substrate disposed on the second nanostructure, and a sealing layer for sealing the first flexible substrate an the second flexible substrate. A method of manufacturing the flexible energy conversion device is also provided.

7 Claims, 3 Drawing Sheets

FLEXIBLE ENERGY CONVERSION DEVICE

RELATED APPLICATIONS

The present application claims priority to Korean Patent Application Serial Number 10-2008-0122650, filed on Dec. 4, 2008, the entirety of which is hereby incorporated by reference.

BACKGROUND OF THE INVENTION

1. Field of the Invention

The present invention relates to a flexible energy conversion device and a method of manufacturing the same. More specifically, the present invention relates to a flexible energy conversion device which comprises a nanostructure grown through a wet process, and to a method of manufacturing the same.

2. Description of the Related Art

An energy conversion device is used to convert energy generated by an energy production device or another type of energy so as to be adapted for necessary end uses. Examples of the energy conversion device include an external combustion engine for converting thermal energy into mechanical energy, a power generator for converting kinetic energy into electrical energy, a motor for converting electrical energy into kinetic energy, a solar cell for converting light energy into electrical energy, etc. In particular, as for the solar cell, many attempts to convert light energy into electrical energy have been made since the French scientist Becquerel discovered that exposing two metal electrodes submerged in an electrolyte solution to light increases the amount of electricity generated, which is called the photovoltaic effect. A solar cell was first developed at Bell Labs in 1958, and was then actually used as a power source of the Vanguard spacecraft. After the 1980s, solar cells began to be utilized as a terrestrial power source. The solar cell is classified depending on its material of manufacture into an inorganic solar cell such as a silicon, compound or compound tandem solar cell, an organic solar cell such as a dye or polymer solar cell, and an organic-inorganic hybrid cell. Solar cell devices are very difficult to use as a power supply because materials for the devices contain environmentally unfriendly elements and the photovoltaic effect cannot be ensured in the absence of light. Also, most of the solar cell devices adopt an inorganic substrate, and thus their applications to the fields which are environmentally friendly and biocompatible are limited.

Meanwhile, conventional fabrication method of a nanostructure is used to perform a chemical growth method such as MOCVD (Metal-Organic Chemical Vapor Deposition), or a physical growth method such as VSLE (Vapor Liquid Solid Epitaxial), PLD (Pulsed Laser Deposition) and so on, all of which may be performed at a high temperature of 500° C. or more in order to stably grow a nanostructure. Specifically, the nanostructure is conventionally grown in a manner such that a noble metal is deposited in the form of a thin film having a thickness of the nano-level on a substrate through sputtering or thermal evaporation, and the thin film deposited at the nano level is thermally treated, thus forming a noble metal assembly having a thickness of ones of nm, which is then grown into a nanostructure using MOCVD, VSLE, PLD or a sol-gel process as mentioned above. However, this conventional method has some drawbacks, such as process complexity, low productivity, and large equipment for its growing. Moreover, although conventional fabrication of the nanostructure enables the use of an inorganic substrate, using inorganic substrates which are hard imposes limitations on allowing the device to be available in diverse shapes and to be used in a variety of places.

SUMMARY OF THE INVENTION

Accordingly, the present invention has been made keeping in mind the above problems occurring in the related art. An object of the present invention is to provide a flexible energy conversion device able to convert mechanical energy into electrical energy without the use of the photovoltaic effect.

Also another object of the present invention is to provide a flexible energy conversion device using oscillation occurring by growing a nanostructure on a flexible substrate under environmentally friendly and biocompatible conditions Also another object of the present invention is to provide a flexible energy conversion device, which comprises an oxide-based nanostructure grown on a flexible substrate through a chemical wet process.

Also another object of the present invention is to provide a method of manufacturing the flexible energy conversion device, which enables the growth of a nanostructure at room temperature/medium temperature.

Also another object of the present invention is to provide the use of the flexible energy conversion device for converting mechanical energy into electrical energy as a self-powered generator including a medical device, a bio/chemical sensor, a portable electronic product, etc.

In order to achieve the object, the present invention provides a flexible energy conversion device, comprising a first flexible substrate, a transparent electrode disposed on the first flexible substrate, a first nanostructure disposed on the transparent electrode and comprising a transition metal oxide or semi-metal oxide, a second nanostructure disposed on the first nanostructure, a second flexible substrate disposed on the second nanostructure, and a sealing layer for sealing the first flexible substrate and the second flexible substrate.

Another aspect of the present invention provides a method of manufacturing the flexible energy conversion device, comprising providing a solute containing a transition metal or semi-metal, mixing the solute with a solvent to prepare a solution and immersing a first flexible substrate having a transparent electrode formed thereon in the solution to form a first nano structure.

BRIEF DESCRIPTION OF THE DRAWINGS

The features and advantages of the present invention will be more clearly understood from the following detailed description taken in conjunction with the accompanying drawings, in which.

DESCRIPTION OF SPECIFIC EMBODIMENTS

Hereinafter, a detailed description will be given of the present invention.

I. Flexible Energy Conversion Device

Figure 1:
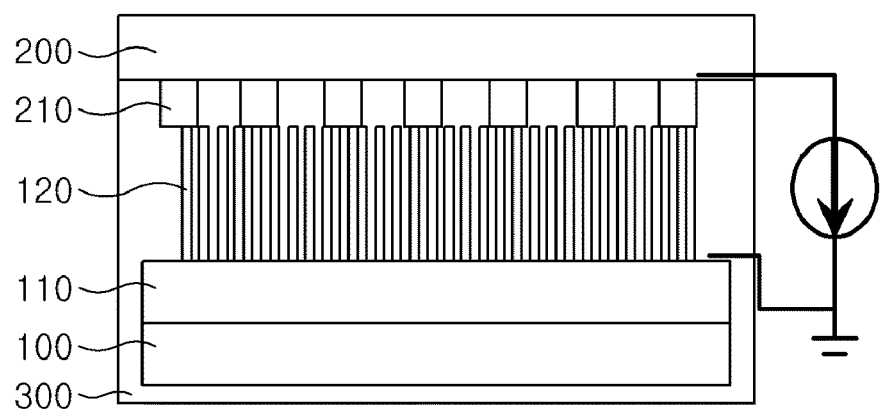
FIG. 1 is a cross-sectional view showing a flexible energy conversion device manufactured through a manufacturing process according to the present invention.

FIG. 1 is a cross-sectional view showing a flexible energy conversion device according to an embodiment of the present invention.

With reference to FIG. 1, the flexible energy conversion device according to the present invention comprises a first flexible substrate 100, a transparent electrode 110 disposed on the first flexible substrate 100, a first nanostructure 120 disposed on the transparent electrode 110, a second nanostructure 210 disposed on the first nanostructure 120, a second flexible substrate 200 disposed on the second nanostructure 210, and a sealing layer 300 for sealing the first flexible substrate 100 and the second flexible substrate 200. The flexible energy conversion device converts mechanical energy into electrical energy.

The first flexible substrate 100 is preferably made of one or more selected from the group consisting of PET (polyethylene terephthalate), PEN (polyethylene naphthalate), polyimide, PAR (polyacrylate), PES (polyethersulfone), PC (polycarbonate), polynorbonene, and Arylite. The transparent electrode 110 is preferably made of one or more selected from the group consisting of ITO (Indium Tin Oxide), ZnO, and $SnO_2$ with and without being doped with one or more selected from the group consisting of Al, Ga, Zn, and F. The first nanostructure 120 is preferably provided in the form of any one selected from the group consisting of nanorods, nanowires, nanowalls, nanotubes, and nanobelts. The first nanostructure 120 comprises transition metal oxide or semi-metal oxide. The transition metal is preferably one or more selected from the group consisting of Fe, Ti, V, Cr, Zn, Y, Zr, Nb, and W. And the semi-metal is preferably one or more selected from the group consisting of Si, Ge and As.

Also, the second nanostructure 210 may be preferably provided in the form of any one selected from the group consisting of nanorods, nanowires, nanowalls, nanotubes, nanoembossments and nanobelts. The second nanostructure 210 preferably comprises one or more selected from the group consisting of Ru, Rd, Pd, Os, Ir, Pt, Ag, Au, Ni, and Ni oxide. And the second nanostructure 210 preferably has a length of 10~10,000 nm and a thickness of 10~10,000 nm. The second flexible substrate 200 is preferably made of one or more selected from the group consisting of PET (polyethylene terephthalate), PEN (polyethylene naphthalate), polyimide, PAR (polyacrylate), PES (polyethersulfone), PC (polycarbonate), polynorbonene and Arylite. The sealing layer is preferably made of one or more selected from the group consisting of polystyrene resin, acrylonitrile/butadiene/styrene resin, acrylic resin, polycarbonate, polyphenylene oxide, vinyl chloride, soft/hard polypropylene, glass reinforced fiber, polybutylene terephthalate, phenol, and parylene resin.

II. Method of Manufacturing Flexible Energy Conversion Device

The method of manufacturing the flexible energy conversion device according to the present invention comprises (A) providing a solute containing a transition metal or semi-metal. An example of the transition metal or semi-metal is described above and thus the description thereof is omitted. Also, the solute is preferably represented by $M(CH_3COO)_2$, in which M is a transition metal or semi-metal.

The method of manufacturing the flexible energy conversion device according to the present invention comprises (B) preparing a solution by mixing the solute with a solvent. The solvent is preferably any one selected from the group consisting of methanol ($CH_3OH$), ethanol ($C_2H_5OH$), ethylene glycol ($C_2H_4(OH)_2$), glycerol ($C_3H_5(OH)_3$), propanol ($C_3H_7OH$), butanol ($C_4H_9OH$), phenol ($C_6H_5OH$), catechol ($C_6H_4(OH)_2$), cresol ($C_6H_4(CH_3)OH$), pyrogallol ($C_6H_3(OH)_3$), and naphthol ($C_{10}H_7(OH)$).

The solute and the solvent is preferably mixed at a ratio of 1:1~1:5,000, and stirred at 50~300° C. for a period of time in the range of 1 sec to 24 hours, thus preparing the solution. As such, the stirring is preferably performed through a typical stirring process. An example of the typical stirring process includes a stirring using a stirrer such as a rod in a solution or an ultrasonic stirring. Such stirring makes the solute and the solvent be more uniformly mixed, and also allows the transition metal or semi-metal contained in the solute to be bonded with oxygen contained in the hydroxyl group of the solvent to thus facilitate the formation of the first nanostructure in a subsequent process.

The method of manufacturing the flexible energy conversion device according to the present invention comprises (C) forming a first nanostructure by immersing a first flexible substrate having a transparent electrode formed thereon in the solution. In (C), the first flexible substrate having the transparent substrate formed thereon is immersed in the solution at 50~300° C. for a period of time in the range of 1 sec to 24 hours to form the first nanostructure. When the first flexible substrate having the transparent electrode formed thereon is immersed in the solution at the above temperature for the above period, the transition metal or semi-metal in the solution is bonded with oxygen to form nano-sized metal oxide, which is then attached to the transparent electrode, thereby obtaining the first nanostructure which is an oxide-based nanostructure. The first nanostructure may be represented by $M_xO_y$, in which x and y are stoichiometric ratios between M (transition metal or semi-metal) and O (oxygen).

In the above method, (C) may further comprises, after the formation of the first nanostructure, drying the first nanostructure at 50~500° C. for a period of time in the range of 1 sec to 24 hours and thermally treating the dried first nanostructure at 50~500° C. for a period of time in the range of 1 sec to 24 hours in any one atmosphere selected from the group consisting of a vacuum, an inert gas, an oxidizable gas, and a reducible gas. The drying may be carried out in order to remove the residual solution, and may be conducted in a vacuum or inert gas atmosphere. The thermal treatment is performed so that the dried first nanostructure becomes stable and has a uniform composition ratio.

The method of manufacturing the flexible energy conversion device according to the present invention may further comprises (D) forming a thin film on a second flexible substrate, (E) forming a nanotemplate on the thin film, (F) forming a second nanostructure on the nanotemplate, and (G) disposing the first flexible substrate and the second flexible substrate so that the first nanostructure and the second nanostructure face each other and then sealing them.

In (D), the thin film is preferably formed on the second flexible substrate at room temperature through any one process selected from the group consisting of MOCVD, VSLE, PLD, sputtering, sol-gel technologies, electroplating and ion plating. The thin film preferably has a thickness of 1~10,000 nm. And the thin film is preferably made of one or more selected from the group consisting of Ti, Cr, Mn, Fe, Co, Ni, Cu, Zn, Se, Ag, Sn, W, Au and Pb, having high work function. The thin film functions as a base which facilitates the formation of the second nanostructure in a subsequent process.

The second flexible substrate is described above and the description thereof is omitted.

In the above method, (E) is preferably performed by forming a pre-nanotemplate on the thin film through any one selected from the group consisting of anodizing p, electroplating, and sol-gel method, and then chemically etching the pre-nanotemplate to form the nanotemplate. The solution used for the chemical etching is not necessarily limited, and oxalic acid is particularly useful. The nanotemplate is porous, and preferably includes any one selected from the group consisting of Al, Al—Mn, Al—Mg, Al—Cu—Mg, Al—Mg—Si and Al—Cu—Si. As such, the nanotemplate functions to define a region required to grow the second nanostructure in a subsequent process.

In the above method, (F) is preferably performed by forming the second nanostructure on the nanotemplate using any one selected from the group consisting of low-temperature CVD, PLD, sputtering, sol-gel method, MOCVD and ALD. Also, (F) preferably further comprises, after forming the second nanostructure, removing the thin film and the nanotemplate and then thermally treating the second nanostructure at 50~500° C. for a period of time in the range of 1 sec to 24 hours in any one atmosphere selected from the group consisting of a vacuum, an inert gas, an oxidizable gas, and a reducible gas. The removal of the thin film and the nanotemplate may be performed using an etchant composed of 6 wt % $H_3PO_4$+1.8 wt % $CrO_3$. The thermal treatment of the second nanostructure may be conducted so that the second nanostructure becomes stable and has a uniform composition ratio. As such, the second nanostructure preferably has a length of 10~10,000 nm, and a thickness of 10~10,000 nm. The description of the second nanostructure is omitted.

In the above method, (G) preferably further comprises, after sealing the first and second flexible substrates, thermally treating the sealed first and second flexible substrates at 50~500° C. for 1~120 min in any one atmosphere selected from the group consisting of a vacuum and an inert gas. Through such thermal treatment, a more stable flexible energy conversion device can be manufactured. The sealing layer for sealing the first and second flexible substrates is described above and thus the description thereof is omitted.

Because the flexible energy conversion device according to the present invention may be manufactured at room temperature/medium temperature, inherent properties of the transparent electrode disposed in the device may be maintained, and inherent properties of the flexible substrate may also be maintained, so that the device is available in diverse shapes and can be used in a variety of places. Also, the method of manufacturing the flexible energy conversion device according to the present invention is a simple process and reduces the manufacturing cost. Moreover, the flexible energy conversion device according to the present invention is composed of environmentally friendly and biocompatible material and thus can be employed in bio-related fields, which are currently rapidly developing, and inside the human body. The flexible energy conversion device manufactured through the method according to the present invention can convert mechanical energy into electrical energy using proper oscillation of material employed therein and thus can be self-powered, thereby obviating a need for an external power source.

A better understanding of the present invention regarding the flexible energy conversion device may be obtained through the following examples which are set forth to illustrate, but are not to be construed as limiting the present invention.

EXAMPLE 1

Manufacture of Flexible Energy Conversion Device

A solute composed of Si dissolved in $(CH_3COO)_2$ and a solvent composed of $CH_3OH$ were provided, mixed at a ratio of 1:50, and stirred at 60° C. for 10 hours, thus preparing a solution. Further, a first flexible substrate having a size of 10 mm×10 mm and made of PET and including a transparent electrode made of ITO and having a thickness of 180 nm was provided. The first flexible substrate including the transparent electrode formed thereon was immersed in the above solution at 100° C. for 10 hours, thus forming a first nanostructure. Subsequently, the first nanostructure was dried at 100° C. for 10 hours, and then thermally treated at 250° C. for 10 hours in a vacuum.

Also, a second flexible substrate having a size of 10 mm×10 mm and made of PET was provided, and Ti was provided in the form of a thin film at a thickness of 100 nm on the second flexible substrate through MOCVD. Then, Al was anodized on the thin film, and etching was performed using 0.3 mol % oxalic acid, thus preparing a nanotemplate. Then, Pt was formed in the nanotemplate through MOCVD, thus forming a second nanostructure. The second flexible substrate including the thin film, the nanotemplate and the second nanostructure was immersed in a solution of 6 wt % $H_3PO_4$+ 1.8 wt % $CrO_3$ for 4 hours, thus removing the thin film and the nanotemplate. Subsequently, the second nanostructure was thermally treated at 250° C. for 10 hours in a vacuum. Subsequently, the first flexible substrate and the second flexible substrate were disposed so that the first nanostructure and the second nanostructure faced each other, and then sealed with a polystyrene resin, thereby completing a flexible energy conversion device.

EXAMPLE 2

Manufacture of Flexible Energy Conversion Device

A first solution including Si and $(CH_3COO)_2.2H_2O$ mixed at a ratio of 1:1 was provided, and $CH_3OH$ was provided as a second solution. The first solution and the second solution were mixed at a ratio of 1:50, and stirred at 60° C. for 10 hours, thus preparing a solution. Further, a first flexible substrate having a size of 10 mm×10 mm and made of PET and including a transparent electrode made of ITO and having a thickness of 180 nm was provided. The first flexible substrate including the transparent electrode formed thereon was immersed in the above solution at 100° C. for 10 hours thus forming a first nanostructure. Subsequently, the first nanostructure was dried at 100° C. for 10 hours, and then thermally treated at 250° C. for 10 hours in a vacuum.

In addition, a second flexible substrate having a size of 10 mm×10 mm and made of PET was provided, and Ti was provided in the form of a thin film at a thickness of 100 nm on the second flexible substrate through MOCVD. Then, Al was anodized on the thin film, and etching was performed using 0.3 mol % oxalic acid, thus preparing a nanotemplate. Then, Pt was formed in the nanotemplate through MOCVD, thus forming a second nanostructure. The second flexible substrate including the thin film, the nanotemplate and the second nanostructure was immersed in a solution of 6 wt % $H_3PO_4$+ 1.8 wt % $CrO_3$ for 2 hours, thus removing the thin film and the nanotemplate. Subsequently, the second nanostructure was thermally treated at 250° C. for 10 hours in a vacuum. Subsequently, the first flexible substrate and the second flexible substrate were disposed so that the first nanostructure and the second nanostructure faced each other, and then sealed with a polystyrene resin, thereby completing a flexible energy conversion device.

TEST EXAMPLE

Evaluation of Properties of Flexible Energy Conversion Device

Figure 2:
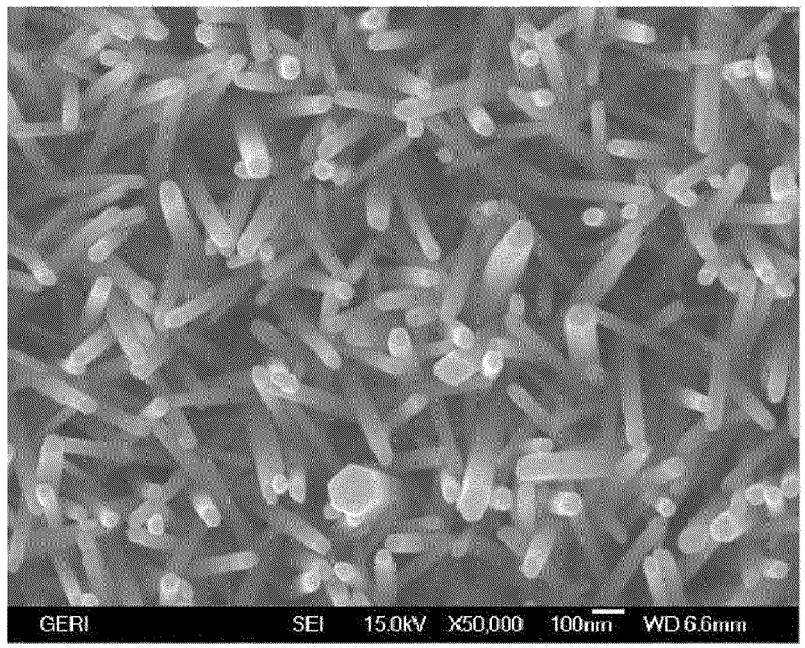
FIG. 2 is an SEM image showing a first nanostructure of the flexible energy conversion device manufactured in Example 1.

FIG. 2 is an FE-SEM image showing the first nanostructure of the flexible energy conversion device manufactured in Example 1.

With reference to FIG. 2, the first nanostructure is in nanowire form.

Figure 3:
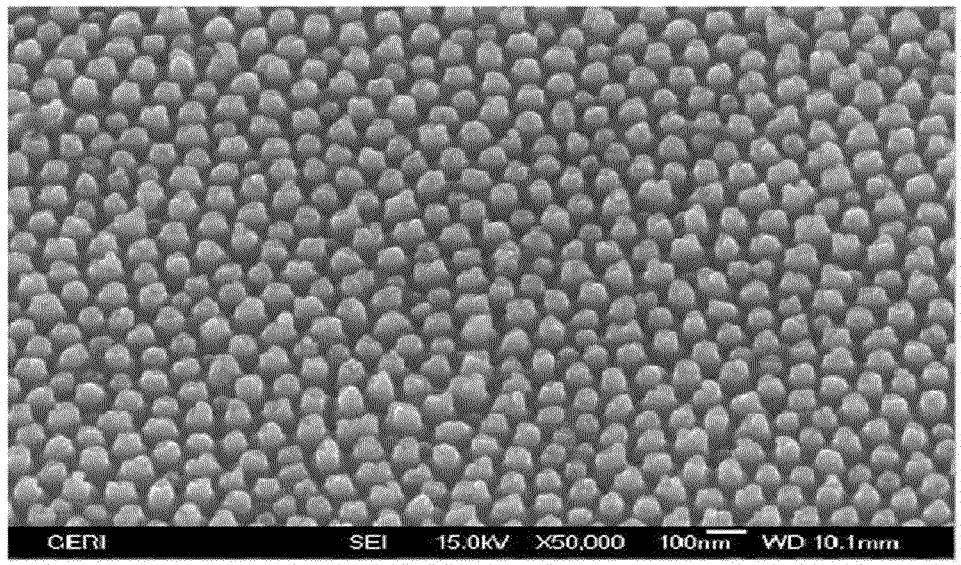
FIG. 3 is an FE-SEM image showing a second nanostructure of the flexible energy conversion device manufactured in Example 1.
Figure 4:
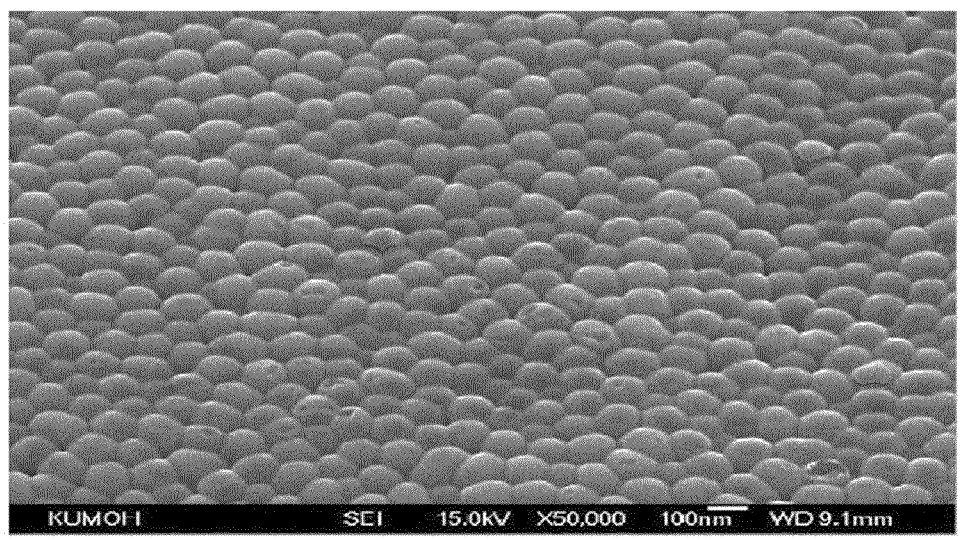
FIG. 4 is an FE-SEM image showing a second nanostructure of the flexible energy conversion device manufactured in Example 2.

FIG. 3 is an FE-SEM image showing the second nanostructure of the flexible energy conversion device manufactured in Example 1, and FIG. 4 is an FE-SEM image showing the second nanostructure of the flexible energy conversion device manufactured in Example 2.

With reference to FIGS. 3 and 4, in the case of the flexible energy conversion device manufactured in Example 1, the second nanostructure is in nanowire form, and in the case of the flexible energy conversion device manufactured in Example 2, the second nanostructure is in nanoembossment form.

Figure 5:
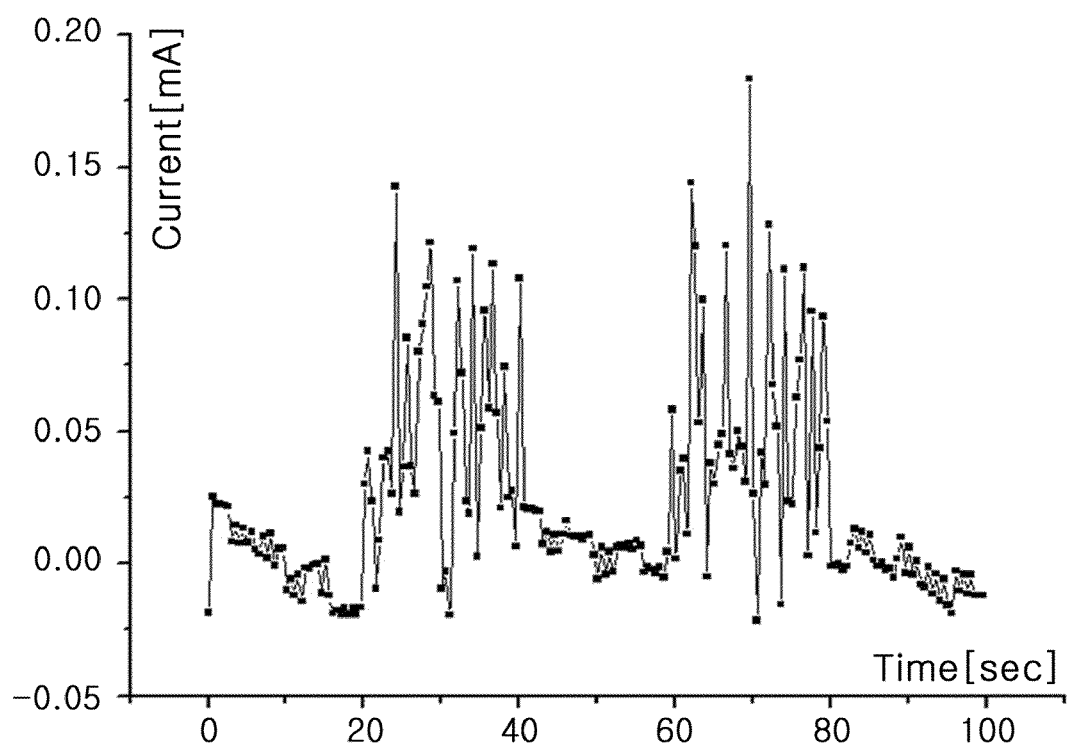
FIG. 5 is a graph showing changes in output current of the flexible energy conversion device manufactured in Example 1.

FIG. 5 is a graph showing changes in output current of the flexible energy conversion device manufactured in Example 1.

With reference to FIG. 5, even when noise occurs, the output current of the device is produced because of the generation of oscillation of the device.

As described hereinbefore, the present invention provides a flexible energy conversion device and a method of manufacturing the same. According to the present invention, the flexible energy conversion device can be manufactured at room temperature/medium temperature, thus maintaining inherent properties of a transparent electrode disposed in the device and inherent properties of a flexible substrate. Hence, the flexible energy conversion device is available in diverse shapes and can be used in a variety of places. Also, the method of manufacturing the flexible energy conversion device according to the present invention is a simple process and can reduce the manufacturing cost. Furthermore, the flexible energy conversion device according to the present invention is composed of environmentally friendly and biocompatible material, and can thus be applied to bio-related fields, which are currently rapidly developing, or inside the human body. The flexible energy conversion device manufactured by the method according to the present invention can convert mechanical energy into electrical energy using proper oscillation of material employed therein, and can be self-powered, thus obviating the need for an external power source.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A flexible energy conversion device, comprising:
   a first flexible substrate;
   a transparent electrode disposed on the first flexible substrate;
   a first nanostructure disposed on the transparent electrode and comprising a transition metal oxide or semi-metal oxide;
   a second nanostructure disposed on the first nanostructure;
   a second flexible substrate disposed on the second nanostructure; and
   a sealing layer for sealing the first flexible substrate and the second flexible substrate.

2. The flexible energy conversion device as set forth in claim 1, wherein the first flexible substrate and the second flexible substrate each comprise one or more selected from the group consisting of PET (polyethylene terephthalate), PEN (polyethylene napthalate), polyimide, PAR (polyacrylate), PES (polyethersulfone), PC (polycarbonate), polynorbonene, and Arylite.

3. The flexible energy conversion device as set forth in claim 1, wherein the transparent electrode comprises one or more selected from the group consisting of ITO (Indium Tin Oxide), ZnO and $SnO_2$ with and without being doped with one or more selected from the group consisting of Al, Ga, Zn, and F.

4. The flexible energy conversion device as set forth in claim 1, wherein the first nanostructure and the second nanostructure each are provided in any one form selected from the group consisting of nanorods, nanowires, nanowalls, nanotubes, nanoembossments, and nanobelts.

5. The flexible energy conversion device as set forth in claim 1, wherein the transition metal comprises one or more selected from the group consisting of Fe, Ti, V, Cr, Zn, Y, Zr, Nb and W, and the semi-metal comprises one or more selected from the group consisting of Si, Ge, and As.

6. The flexible energy conversion device as set forth in claim 1, wherein the second nanostructure comprises one or more selected from the group consisting of Ru, Rd, Pd, Os, Ir, Pt, Ag, Au, Ni, and Ni oxide.

7. The flexible energy conversion device as set forth in claim 1, wherein the sealing layer comprises one or more selected from the group consisting of polystyrene resin, acrylonitrile/butadiene/styrene resin, acrylic resin, polycarbonate, polyphenylene oxide, vinyl chloride, soft/hard polypropylene, glass reinforced fiber, polybutylene terephthalate, phenol, and parylene resin.

* * * * *